(12) United States Patent
Takahashi et al.

(10) Patent No.: US 7,602,269 B2
(45) Date of Patent: Oct. 13, 2009

(54) PERMANENT CURRENT SWITCH

(75) Inventors: Masaya Takahashi, Hitachinaka (JP);
Kazuhide Tanaka, Hitachi (JP);
Michiya Okada, Mito (JP)

(73) Assignee: Hitachi, Ltd., Tokyo (JP)

( * ) Notice: Subject to any disclaimer, the term of this patent is extended or adjusted under 35 U.S.C. 154(b) by 43 days.

(21) Appl. No.: 11/654,008

(22) Filed: Jan. 17, 2007

(65) Prior Publication Data
US 2007/0194870 A1 Aug. 23, 2007

(30) Foreign Application Priority Data
Feb. 20, 2006 (JP) ............................. 2006-041800

(51) Int. Cl.
*H01F 7/00* (2006.01)
*H01F 1/00* (2006.01)
*H01F 6/00* (2006.01)

(52) U.S. Cl. .................. 335/216; 335/217; 174/125.1; 361/19; 361/20; 361/21; 361/139; 361/141; 336/155

(58) Field of Classification Search ......... 335/216–217; 174/125.1; 361/19–21, 139–141; 336/155
See application file for complete search history.

(56) References Cited

U.S. PATENT DOCUMENTS

| | | | | |
|---|---|---|---|---|
| 6,133,814 A | * | 10/2000 | Okada et al. | 335/216 |
| 7,157,999 B2 | * | 1/2007 | Kasten | 335/216 |
| 2003/0173103 A1 | * | 9/2003 | Morita et al. | 174/125.1 |
| 2004/0121915 A1 | * | 6/2004 | Tanaka et al. | 505/100 |
| 2004/0189427 A1 | * | 9/2004 | Leghissa et al. | 335/216 |
| 2004/0204322 A1 | * | 10/2004 | Tanaka et al. | 505/100 |
| 2005/0174202 A1 | * | 8/2005 | Tanaka et al. | 335/6 |
| 2006/0072254 A1 | * | 4/2006 | Sargent et al. | 361/19 |
| 2006/0240991 A1 | * | 10/2006 | Takahashi et al. | 505/300 |

FOREIGN PATENT DOCUMENTS

| | | | |
|---|---|---|---|
| JP | 09205016 A | * | 8/1997 |
| JP | 2001283660 A | * | 10/2001 |
| JP | 2003-37303 A | | 2/2003 |
| JP | 2003092032 A | * | 3/2003 |
| JP | 2003331660 A | * | 11/2003 |

* cited by examiner

*Primary Examiner*—Elvin G Enad
*Assistant Examiner*—Mohamad A Musleh
(74) *Attorney, Agent, or Firm*—Crowell & Moring LLP

(57) ABSTRACT

There is disclosed a permanent current switch which has a high temperature margin and which is thermally stable and which securely performs a switching operation between a superconducting state and a normal conducting state. The permanent current switch of the present invention has a coiled superconducting wire and a heater wire which switches the superconducting wire between the superconducting state and the normal conducting state, the superconducting wire is a magnesium diboride superconducting wire having a high-resistance metal on an outer side and a magnesium diboride superconducting portion on an inner side and prepared by forming a superconducting metal on a layer between the high-resistance metal and the magnesium diboride superconducting portion, and the permanent current switch further comprises a superconductive connecting section superconductively connected to a lead wire guided from the superconducting wire and a superconducting wire for a wiring line.

10 Claims, 6 Drawing Sheets

PERMANENT CURRENT SWITCH

BACKGROUND OF THE INVENTION (1) Field of the Invention

The present invention relates to a permanent current switch having a coiled superconducting wire and a heater wire, which is prepared using, in the superconducting wire, a magnesium diboride superconducting (hereinafter abbreviated as $MgB_2$) wire (hereinafter referred to as the $MgB_2$ wire) that exhibits a superconducting property in an environment not in excess of a critical temperature.

(2) Description of Related Art

The $MgB_2$ wire has a critical temperature of 39 K, which is about 20 K or more higher than that of an ordinary metal-based superconducting material. The wire also has a high critical magnetic field, and this is said to be about 50 T on a thin film. In addition, since the wire has a remarkably small anisotropic magnetic field and an excellent flexural property, it has a very few differences from the ordinary metal-based superconducting material in preparing and handling of a wire material.

A permanent current switch is one of applications utilizing a very high thermal stability of this $MgB_2$ wire.

A permanent current switch using this $MgB_2$ wire is described in JP-A-2003-37303.

The permanent current switch is generally formed using an NbTi wire in which a CuNi alloy is used as a stabilization material. However, NbTi has a critical temperature as low as about 9 K, and has a temperature margin of only about 5 K in liquid helium having a critical temperature of 4.2 K. Therefore, the NbTi wire may be easily transferred to a normal conducting state even when small disturbance energy is applied. For such a reason, a permanent current switch has been developed using the $MgB_2$ wire having a temperature margin of 35 K in liquid helium.

However, there has been a problem that even if the permanent current switch is prepared simply using the $MgB_2$ wire, the switch has a resistance of about $1 \times 10^{-10}$ Ω, and a highly reliable permanent current switch having a less resistance value cannot be prepared.

BRIEF SUMMARY OF THE INVENTION

An object of the present invention is, therefore, to provide a permanent current switch which has a high temperature margin and which is thermally stable and which ensures a switching operation between a superconducting state and a normal conducting state of a superconducting wire.

A permanent current switch of the present invention has a coiled superconducting wire and a heater wire which switches the superconducting wire between a superconducting state and a normal conducting state, the superconducting wire being a magnesium diboride superconducting wire having a high-resistance metal on an outer side and a magnesium diboride superconducting portion on an inner side and prepared by forming a superconducting metal on a layer between the high-resistance metal and the magnesium diboride superconducting portion, the permanent current switch further comprising: a superconductive connecting section superconductively connected to a lead wire guided from the superconducting wire and a superconducting wire for a wiring line.

Moreover, the superconducting wire for use in the permanent current switch of the present invention is a multi-core magnesium diboride superconducting wire having a plurality of magnesium diboride superconducting cores formed by coating magnesium diboride superconducting portions with a superconducting metal and prepared by arranging the plurality of magnesium diboride superconducting cores in a high-resistance metal.

Furthermore, it is preferable that the superconductive connecting section superconductively connects the magnesium diboride superconducting portion or the superconducting metal with which the magnesium diboride superconducting portion is coated to a superconducting core portion of the superconducting wire for the wiring line via a low-melting superconducting metal or a low-melting superconducting alloy.

Moreover, it is preferable that the high-resistance metal is an alloy containing Cu as a main component. It is to be noted that examples of the alloy containing Cu as the main component preferably include CuNi, CuSn, CuZn, CuMn, CuMg, CuIn, CuCo and CuCr.

Furthermore, it is preferable that the superconducting metal is an alloy containing Nb as a main component. It is to be noted that examples of the alloy containing Nb as the main component include Nb, NbTi and NbTa.

In addition, it is preferable that the low-melting superconducting metal or the low-melting superconducting alloy is made of at least one or more metals of Sn, Mg, In, Ga, Pb, Te, Tl, Zn, Bi and Al.

Moreover, a superconducting magnet of the present invention can realize a thermally stable permanent current operation by use of these permanent current switches.

Furthermore, to achieve the object of the present invention, it is possible to apply a method of manufacturing a permanent current switch, comprising: winding a magnesium diboride superconducting wire or a multi-core magnesium diboride superconducting wire and a heater wire to form a coil shape; and superconductively connecting a lead wire guided from the superconducting wire to a superconducting wire for a wiring line.

In addition, according to a predetermined embodiment, it is possible to provide a highly reliable permanent current switch which allows a magnetic field to decay.

According to the present invention, there can be provided a permanent current switch which has a high temperature margin and which is thermally stable and which can securely perform an operation of switching a superconducting wire between a superconducting state and a normal conducting state.

DETAILED DESCRIPTION OF THE INVENTION

There are the following two methods as a method of operating a superconducting magnet.

One method is to constantly supply a current from a power supply to a superconducting coil constituting the superconducting magnet.

Another method is to connect a permanent current switch and the superconducting coil constituting the superconducting magnet in parallel to a power supply, excite the superconducting coil, and then separate the superconducting coil from the power supply by use of this permanent current switch to shift to a permanent current operation.

In most of a presently available nuclear magnetic resonance analyzer (hereinafter abbreviated as NMR), a medical magnetic resonance imaging diagnosis equipment (MRI), a magnetically-elevated train and the like, the superconducting magnet operates using the latter permanent current operation.

Figure 1:
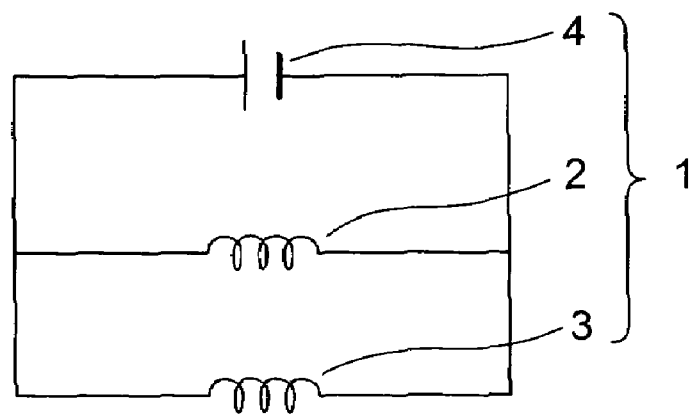
FIG. 1 is a diagram showing a closed circuit for a general permanent current operation.

The permanent current operation using the permanent current switch will be described with reference to FIG. 1.

A superconducting coil 2 constituting a superconducting magnet 1 which should carry out the permanent current operation is provided with a short-circuit switch 3 disposed in parallel between terminals of the coil. This short-circuit switch 3 is referred to as a permanent current switch 3, and is formed of a superconducting wire to lower a resistance during short-circuiting. It is to be noted that here the superconducting magnet 1 includes the superconducting coil 2 and the permanent current switch 3. Reference numeral 4 is a power supply.

A procedure of the permanent current operation is described in the following 1-1 to 1-4:

1-1. Using a critical temperature and a state in excess of a critical magnetic field (e.g., heating of a heater or excitation) of the superconducting wire forming the permanent current switch 3 or any other external disturbance, the superconducting wire is brought into a normal conducting state (hereinafter abbreviated as PCS-OFF) to generate a resistance.

1-2. A power supply 4 supplies a power to the superconducting coil 2 until a rated current value is reached, thereby exciting the coil.

1-3. The external disturbance which brings the permanent current switch 3 into the normal conducting state is stopped, the permanent current switch 3 is brought into the superconducting state (hereinafter abbreviated as PCS-ON), and the current value of the power supply 4 is reduced.

1-4. The permanent current operation is possible between the superconducting coil 2 and permanent current switch 3.

On the other hand, characteristics described in the following 2-1 to 2-4 are required for the permanent current switch 3:

2-1. A resistance during PCS-ON is small.

2-2. A resistance during PCS-OFF is large.

2-3. The rated current can be supplied stably for a long period.

2-4. This switch should not shift to the normal conducting state unless needed.

When an MgB$_2$ wire is applied as the superconducting wire of such a permanent current switch 3, the following requirements 3-1 to 3-4 need to be satisfied:

3-1. The wire has a high critical current which enables energization with a current level corresponding to or exceeding the rated current.

3-2. This wire enables superconductive connection having a very small resistance.

3-3. This wire has a wire material resistance which comparatively increases during PCS-OFF.

3-4. A long MgB$_2$ wire can be prepared which satisfies the requirements 3-1 to 3-3.

A method of preparing the MgB$_2$ wire which satisfies the above requirements 3-1 to 3-4, and the permanent current switch prepared using such a method will hereinafter be described in accordance with examples.

Examples of the present invention will hereinafter be described.

EXAMPLE 1

Figure 2:
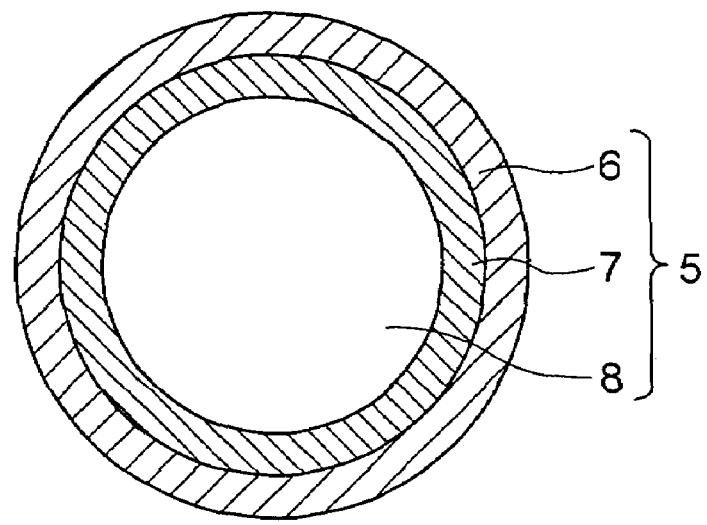
FIG. 2 is a diagram showing a sectional constitution of an $MgB_2$ wire prepared in an embodiment of the present invention.

FIG. 2 shows a sectional structure of a magnesium diboride superconducting wire (an MgB$_2$ wire) in the present embodiment.

An MgB$_2$ wire 5 is constituted of a high-resistance metal 6, a superconducting metal 7, and a magnesium diboride superconducting portion (an MgB$_2$ portion) 8. It is to be noted that the MgB$_2$ wire 5 preferably has a diameter of about 0.3 mm to 2.5 mm.

Figure 3:
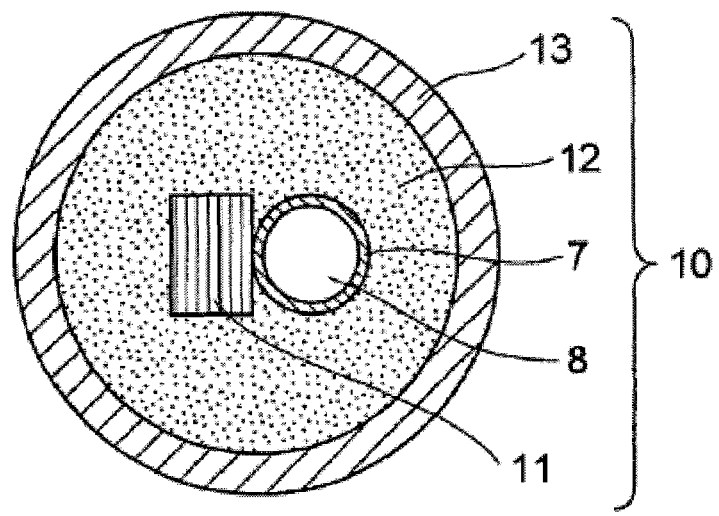
FIG. 3 is a diagram showing a sectional constitution of a superconductive connecting section prepared in the embodiment of the present invention.

FIG. 3 shows a sectional structure of a superconductive connecting section 10 superconductively connected to this MgB$_2$ wire 5 and a superconducting wire for a wiring line.

According to this structure, the superconducting metal 7 constituting the MgB$_2$ wire is connected to a superconducting core portion 11 constituting the superconducting wire for the wiring line via a low-melting superconducting alloy 12 in a superconductive connection tube 13.

Figure 4A:
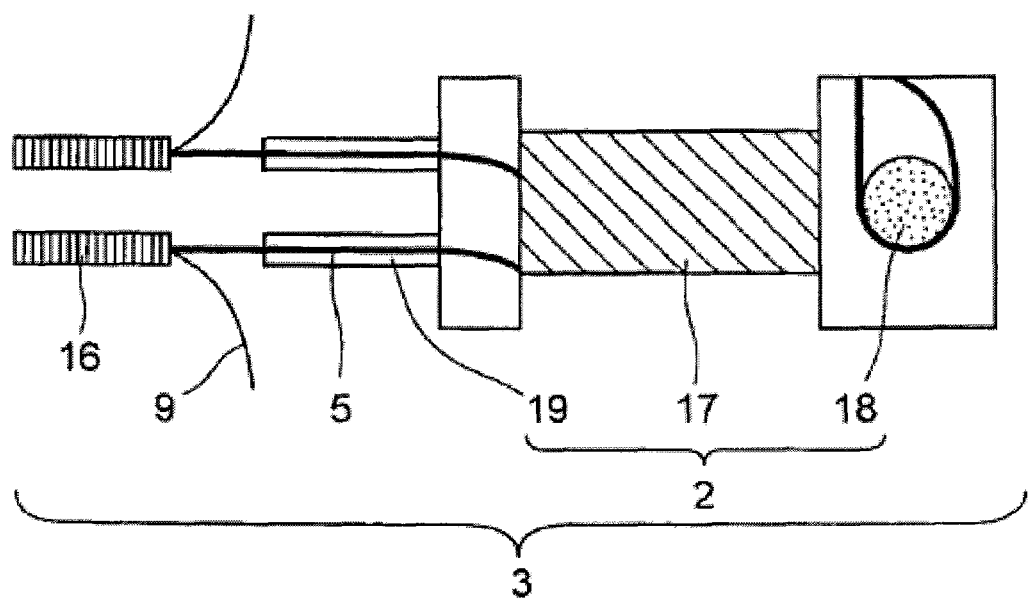
FIG. 4A is a diagram showing a permanent current switch prepared in the embodiment of the present invention.

FIG. 4 shows a permanent current switch 3 in the present embodiment.

Figure 4B:
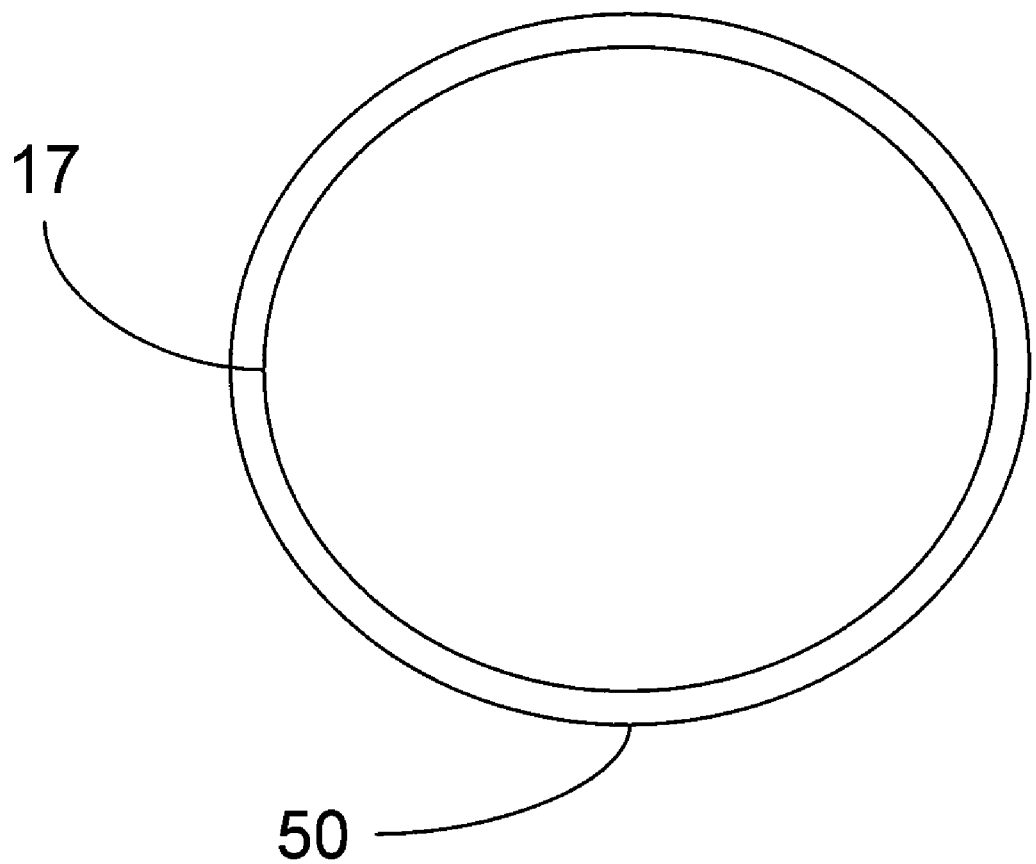
FIG. 4B is a diagram showing a cross-section of a winding portion in the embodiment of the present invention.

This permanent current switch 3 has a superconducting coil 2 and a superconductive connecting section 16. The superconducting coil 2 is also provided with a non-inductively wound winding portion 17, a bending frame 18 which enables non-inductive winding, and a lead wire fixing portion 19. It is to be noted that reference numeral 5 is an MgB$_2$ wire as a lead wire, whereas reference numeral 9 is a superconducting wire for a wiring line. As shown in FIG. 4B, in the present embodiment, a heater wire 50 is formed externally on the winding portion 17 in this embodiment.

In the present embodiment, the permanent current switch 3 prepared using the MgB$_2$ wire 5 satisfies the above requirements 3-1 to 3-4 required for the permanent current switch 3. They will hereinafter be described.

(Regarding the Above 3-1)

The MgB$_2$ wire 5 has a constitution in which the MgB$_2$ portion 8 is coated with a multiple structure of the high-resistance metal 6 and the superconducting metal 7. Therefore, a processing ratio increases in a process of wire material preparation, and the wire has a comparatively high energization characteristic.

Moreover, the superconducting wire is strong against shock, breakage or the like. Therefore, if shift to normal conduction occurs during excitation or during a permanent current operation, a disconnection ratio of the superconducting wire decreases.

(Regarding the Above 3-2)

The $MgB_2$ wire 5 has a constitution in which the $MgB_2$ portion 8 is directly covered using the superconducting metal 7. Therefore, it is preferable to use a melting process in which the superconducting metal 7 is not easily oxidized, even if the high-resistance metal 6 is removed in order to superconductively connect the $MgB_2$ wire 5 to the superconducting wire 9 for the wiring line.

That is, the superconductive connecting section is connected to the $MgB_2$ portion 8, the superconducting metal 7, the low-melting superconducting alloy 12 or a low-melting superconducting metal and the superconducting core portion 11 of the superconducting wire for the wiring line.

In consequence, the superconductive connecting section is basically constituted of a superconductor, and an oxide layer is brought as close to zero as possible in boundaries between the $MgB_2$ portion and the superconducting metal, between the superconducting metal and the low-melting superconducting alloy or the low-melting superconducting metal and between the low-melting superconducting alloy or the low-melting superconducting alloy and the superconducting core portion of the superconducting wire for the wiring line.

Moreover, since the $MgB_2$ portion 8 coated with the superconducting metal 7 is superconductively connected, superconductive connection is possible without deteriorating the energization characteristic of the $MgB_2$ wire 5.

In general, in the $MgB_2$ wire 5 prepared by a powder-in-tube process, a metal sheath which covers the $MgB_2$ portion 8 is peeled, and the $MgB_2$ portion 8 is directly exposed to perform the superconductive connection. Therefore, the energization characteristic of the $MgB_2$ wire 5 remarkably deteriorates. However, in the present embodiment, since the $MgB_2$ portion 8 is not directly exposed, the energization characteristic of the $MgB_2$ wire 5 does not remarkably deteriorate.

Moreover, when the $MgB_2$ portion 8 is directly exposed, a thick oxide layer is formed. Therefore, the superconductive connecting section cannot be constituted of the superconductor, but this can be realized in the present embodiment.

That is, since the $MgB_2$ portion 8 is coated with the superconducting metal 7, during the superconductive connection, the only high-resistance metal 6 formed on the superconducting metal is removed by the melting process to realize the superconductive connection without exposing the $MgB_2$ portion 8.

It is to be noted that the melting process mentioned herein is a process in which the $MgB_2$ wire 5 is immersed into a pot containing a metal for dissolving the high-resistance metal 6 in order to remove the high-resistance metal 6. In consequence, the only high-resistance metal 6 is removed.

(Regarding the Above 3-3)

Since the $MgB_2$ wire 5 is provided with the high-resistance metal 6, an electric resistance per unit length of the $MgB_2$ wire 5 during PCS-OFF increases.

Moreover, the permanent current switch 3 has a structure in which non-inductive winding is possible. Therefore, a wire material applied to the permanent current switch 3 can be lengthened. In consequence, it is possible to increase the electric resistance of the permanent current switch 3 during PCS-OFF.

In consequence, it is possible to prepare the permanent current switch 3 which does not have such a small resistance value as to hinder excitation of the superconducting coil 2 and which has a comparatively large resistance value.

(Regarding the Above 3-4)

The $MgB_2$ wire 5 has a constitution in which the $MgB_2$ portion 8 is coated with a multiple structure of the high-resistance metal 6 and the superconducting metal 7. Therefore, while the high processing ratio is achieved in the process of the wire material preparation, the disconnection ratio can be reduced. It is therefore possible to prepare the $MgB_2$ wire 5 having a length of 10 m or more without being disconnected.

To summarize the above:

1) A wire material structure of the $MgB_2$ wire 5 is a structure constituted of the $MgB_2$ portion 8, the superconducting metal 7 as an outer layer of the $MgB_2$ portion and the high-resistance metal 8 on an outer layer of the superconducting metal 7.

2) A structure of the permanent current switch 3 is a structure in which the non-inductive winding is possible.

When this procedure is performed, it is possible to constitute the permanent current switch 3 including the superconductive connecting section 16 using the long $MgB_2$ wire 5 having a stabilized energization characteristic, the switch having a high resistance value and excellent thermal stability and energization characteristic.

Moreover, as the superconductive connection tube 13, it is preferable to use Nb, NbTi or NbTa. However, in addition, it is possible to apply a superconducting metal having a critical temperature of 4.2 K or more, such as Ta, Pb or V. It is to be noted that as a result of investigation of practical use, a high critical temperature or a high magnetic field is necessary at a melting point which is not less than a thermal treatment temperature of $MgB_2$, and a superconducting metal having hardness and tenacity capable of bearing draw processing is promising. Therefore, it is preferable to form the superconductive connection tube 13 by use of Nb or an Nb alloy such as NbTi or NbTa.

Furthermore, in a case where the wire is used in a so-called super fluid state at a temperature of 4.2 K or less, a metal brought into a superconducting state at a higher temperature can be applied. However, even in this case, as described above, an Nb-based alloy is preferable.

As the high-resistance metal 6, an alloy which realizes both of a cooling effect and a high resistance and which mainly contains Cu can be used such as CuNi, CuSn, CuZn, CuMn, CuMg, CuIn, CuCo or CuCr.

Moreover, it is possible to use an alloy having a high cooling effect, such as Al, Ag, Au or Pt. When practical use is investigated, a Cu alloy is preferable in respect of a high resistance value, a cooling effect and a cost. Above all, a CuNi or CuSn alloy is preferable.

As the low-melting superconducting metal or the low-melting superconducting alloy 12, it is preferable to use a metal or an alloy using at least one or more of Sn, Mg, In, Ga, Pb, Te, Tl, Zn, Bi and Al, and it is possible to apply a metal or an alloy having a melting point of 400° C. or less and having a superconducting characteristic at a critical temperature of 4.2 K.

Moreover, in a case where the wire is used in the so-called super fluid state at a temperature of 4.2 K or less, it is possible to apply the low-melting superconducting metal or the low-melting superconducting alloy 12 brought into the superconducting state at a higher temperature. Since a PbBi alloy or a PbBiSn alloy is a low-melting superconducting alloy having the highest superconducting characteristic among them, it is preferable to use such an alloy.

Since the wire material for use lengthens, as a structure of the permanent current switch 3, non-inductive winding is preferable, because the resistance value of the permanent current switch 3 increases and an inductance of the permanent current switch 3 decreases. However, when the superconducting coil 2 to be excited has a small current value, usual solenoid winding may be performed instead of the non-inductive winding.

Moreover, in either winding way, a material of a bobbin to wind the $MgB_2$ wire 5 may be a stainless steel, a fiber reinforced plastic (FRP), a ceramic or the like. However, in a case where the $MgB_2$ wire 5 required to be thermally treated is used, the stainless steel is most preferable in respect of processing or the like.

Furthermore, in a case where the wound $MgB_2$ wire 5 and heater wire are fixed, insulated or prevented from being broken, it is preferable to perform impregnation with an epoxy resin, wax, beeswax or the like.

As a lead structure of the permanent current switch 3, a structure is preferable in which a lead groove to turn the lead wire is not disposed. The groove may be disposed as the case may be.

In the permanent current switch using a usual NbTi wire, the lead groove is disposed. To improve stability of the NbTi wire, a Cu line is soldered as a co-line and wound together. Therefore, when the $MgB_2$ wire 5 is used in the permanent current switch 3, the switch is thermally stabilized, and the co-line is not required. Therefore, the lead groove is not necessary.

Therefore, in the present embodiment, it is preferable that the groove is not disposed in consideration of simplification of the structure, cost reduction of the permanent current switch 3 and the like.

A manufacturing process of the switch will hereinafter be described.

The $MgB_2$ wire 5 used this time is a superconducting wire having a triple structure of CuNi—Nb—$MgB_2$ parts in which a CuNi alloy is applied to the high-resistance metal 6 and Nb is applied to the superconducting metal 7.

Moreover, an NbTi wire was used in the superconducting wire for the wiring line, and a PbBiSn alloy was used in the low-melting superconducting alloy, when the permanent current switch 3 was prepared.

The $MgB_2$ wire 5 was prepared by a powder-in-tube process.

A procedure will hereinafter be described.

A CuNi tube was used as an outer tube, an Nb tube was used as an inner tube, and the Nb tube was filled with mixed powder of Mg and B. Moreover, the CuNi tube was superimposed on the Nb tube filled with Mg and B, and lengthened to $\phi$0.8 mm by draw processing. Moreover, the lengthened and thinned wire material was coated with a glass insulating coating.

Next, the wire was wound around the bobbin provided with a stainless steel pin by non-inductive winding. A winding length was set to 30 m, when the permanent current switch 3 was prepared. A resistance during PCS-OFF was set to 5 Ω. The wound bobbin was thermally treated at 600° C.×5 hr., and Mg and B in the Nb tube were reacted to form $MgB_2$.

Finally, the thermally treated $MgB_2$ wire 5 wound around the bobbin was impregnated with a resin, and a wire material was fixed to insulate the wire. Furthermore, the Manganin wire was wound around the wire, and impregnated again with the resin. In consequence, the coiled superconducting wire of the permanent current switch 3 was formed.

In this case, a similar effect is obtained even by the following method.

1) As a method of preparing the $MgB_2$ wire 5, either an in-situ method in which the mixed powder of Mg and B is thermally treated to generate $MgB_2$ or an ex-situ method using $MgB_2$ powder can obtain a similar effect, but the in-situ method is more preferable because a high performance can easily be achieved. Even if a carbide-based tertiary element such as SiC or TiC is added to Mg and B, a similar effect is obtained.

2) This time, a double tube of the CuNi tube and the Nb tube was used. However, if another metal tube is interposed between the tubes to constitute a triple tube or a quadruple tube, a similar effect is obtained, and the double tube is most preferable in respect of processability and cost.

3) This time, the double tube including the Nb tube covered with the CuNi tube was formed by the draw processing, but even if a tube including the Nb tube integrated with the CuNi tube beforehand is used, a similar effect is obtained.

4) Even if draw bench processing, extrusion processing, wire processing, static pressure press processing, roller processing or the like is performed instead of the draw processing, a similar effect is obtained.

5) This time, a final processing diameter was set to $\phi$0.8 mm, but the diameter can arbitrarily be determined in accordance with specifications of the permanent current switch 3, but a range of $\phi$0.2 mm to $\phi$3.0 mm is preferable for an actual operation.

6) A winding length was set to 30 m, and a resistance value was set to 5 Ω, but the resistance value is determined by an excitation speed of the superconducting magnet 1, and the winding length is determined by an electric resistance value per unit length of the $MgB_2$ wire 5. Therefore, specific numeric values cannot necessarily be determined, but the larger the resistance value is, the higher the excitation speed of the superconducting magnet 1 can be increased. The larger the electric resistance value per unit length of the wire material is, the shorter the wire material for use becomes. Costs decrease, and stability and coolability improve. That is, when the electric resistance value per unit length is increased, the wire material for use can be shortened. Moreover, it is preferable that the permanent current switch 3 has a large electric resistance during PCS-OFF.

7) This time, thermal treatment conditions were set to 600° C.×5 hr., but a range of about 550° C. to 1000° C.×0.1 hr. to 10 hr. is preferable. At a temperature of 550° C. or less, Mg and B are not generated into $MgB_2$. At a temperature of 1000° C. or more, much of Mg evaporates, and $MgB_2$ is not easily generated. In general, the vicinity of 600° C. to 750° C. is preferable.

8) This time, the Manganin wire was used as the heater wire, but a similar effect can be obtained by a general heater wire such as a nichrome wire having a high resistance and having a melting point which is not less than the thermal treatment temperature of $MgB_2$. This time, the heater wire was wound around the winding portion 17 constituted of the $MgB_2$ wire 5, but a similar effect is obtained even by a method of winding the heater wire around the $MgB_2$ wire 5, a method of disposing the heater wire between the winding portion 17 constituted of the $MgB_2$ wire 5 and the bobbin (the inside), a method of disposing the heater wire along a central axis of the bobbin, a method of disposing the heater wires at upper and lower portions of the bobbin, or a method of disposing the heater wire so as to cover the bobbin.

Next, a structure will be described in which the lead wire is fixed to the lead wire fixing portion 19, and the superconductive connecting section 16 superconductively connects a distal end of the wire to an NbTi wire (the superconducting core portion 11 is NbTi) as the superconducting wire 9 for the wiring line.

First, as the melting process, one end of the $MgB_2$ wire 5, having a 50 mm, was immersed into an Sn bath at 400° C. for 15 minutes, and then removed from the Sn bath.

Next, one end of the NbTi wire as the superconducting wire for the wiring line, having a length of 50 mm, was immersed into an Sn bath at 400° C. for 20 minutes, and then removed from the Sn bath.

At this time, in the $MgB_2$ wire 5, only CuNi as the high-resistance metal 6 melts, Nb as the superconducting metal 7 is not oxidized, and Sn is attached to the $MgB_2$ wire. Subsequently, $Nb_3Sn$ may be generated by a thermal treatment of the Nb tube and Sn. In consequence, a critical magnetic field improves, and more excellent superconductive connection can be formed.

In this case, a similar effect can be obtained even by the following methods.

1) It is preferable that a length to be immersed into the Sn bath is about 5 mm to 500 mm. The connection length is usually determined in accordance with a current value to be energized, but if the length is shorter than 5 mm, an energization current amount rapidly decreases. Conversely, if the length is larger than 500 mm, a device enlarges, and cost rise is caused. Therefore, there is only little effect.
2) Moreover, it is preferable that the conditions of the immersion into the Sn bath are about 250° C. to 650° C.×10 minutes to 120 minutes. These conditions are determined by a Cu ratio of the superconducting wire, the wire material structure and the wire material diameter. Therefore, the conditions cannot necessarily be determined, but excessively high temperature and excessively long time deteriorate the energization characteristic of the superconducting wire. In consequence, it is preferable that the conditions are set to the above range.
3) A similar melting process is possible even with an Mg bath, an In bath, a Ga bath, a Pb bath, a Te bath, a Tl bath, a Zn bath, a Bi bath or an Al bath in addition to the Sn bath. An object of the melting process is to expose the superconducting portion of the superconducting wire in a state in which oxidation is prevented to the maximum. Therefore, a similar effect can be obtained even from a metal bath in which CuNi, Cu or the like as the high-resistance metal 6 formed on an outer periphery of the superconducting wire can be dissolved at a melting point as low as possible.

Next, after the melting process, one end of the $MgB_2$ wire 5 or the superconducting wire 9 for the wiring line (the NbTi wire), having a length of 55 mm, was immersed into a PbBiSn bath at 400° C. for ten minutes, and then removed from the PbBiSn bath. At this time, the $MgB_2$ wire 5 has a state in which the superconducting metal 7 (Nb) is not oxidized and PbBiSn is attached.

In this case, a similar effect is obtained even by the following method.

1) The length to be immersed into the PbBiSn bath is about 5 mm to 500 mm, and it is preferable to immerse the end deeper than in the melting process. This further improves wettability of PbBiSn.
2) It is preferable that conditions of the immersion in the PbBiSn bath are about 150° C. to 650° C.×10 minutes to 60 minutes. The conditions are determined by the Cu ratio of the superconducting wire, the wire material structure and the wire material diameter. Therefore, the conditions cannot necessarily be determined, but excessively high temperature and excessively long time deteriorate the energization characteristic of the superconducting wire. In consequence, it is preferable that the conditions are set to the above range.

Next, the $MgB_2$ wire 5 to which PbBiSn was attached and the superconducting wire 9 for the wiring line (the NbTi wire) were fixed to a Cu wire to prepare a wire material fixing portion.

In this case, the wire material fixing portion is prepared by caulking bonding, spot welding, supersonic welding, diffusion bonding or solid phase diffusion to such a degree that the $MgB_2$ wire 5 does not break. In consequence, firmer superconductive connection can be performed, and the energization characteristic improves.

Finally, after inserting the wire material fixing portion into the superconducting connection tube 13 made of Cu, the tube was filled with PbBiSn. In this case, even if the superconductive connection tube 13 is made of a metal having an excellent coolability such as Cu, Al, Ag or Au; a metal having superconductivity such as Nb or Ta; an alloy of them (e.g., NbTi or NbTa) or the like, a similar superconductive connecting section 16 can be prepared. An object of the superconductive connection tube 13 is to hold PbBiSn in the tube and attach the alloy to the wire material fixing portion.

By the above method, it is possible to prepare the superconductive connecting section 16 which superconductively connects the $MgB_2$ wire 5 to the superconducting wire 9 for the wiring line (the NbTi wire), and the permanent current switch which also serves as the superconductive connecting section is completed.

In the present embodiment, the $MgB_2$ wire 5 which is generally difficult to be superconductively connected is used in the permanent current switch 3. Therefore, the superconductive connecting section 16 which superconductively connects the $MgB_2$ wire 5 to the NbTi wire is constituted as a part of a constituting element of the permanent current switch 3. Therefore, the NbTi wire which is generally easy to be superconductively connected can be used as the superconducting wire for the wiring line.

Next, a permanent current test of the prepared permanent current switch 3 was performed.

Figure 5:
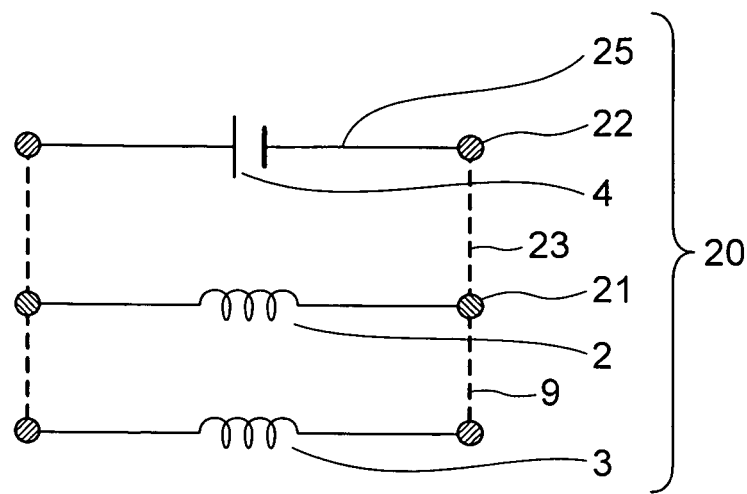
FIG. 5 is a diagram showing a closed circuit for a permanent current operation, prepared in the embodiment of the present invention.

A circuit diagram is shown in FIG. 5.

For the test, the superconducting wire 9 for the wiring line having the NbTi wire was superconductively connected to the superconducting coil 2 made of NbTi and an NbTi wire 23 for a current lead to prepare a closed loop circuit 20 for the permanent current test.

Moreover, the NbTi wire 23 for the current lead was soldered to a power lead 25 of the power supply 4.

The test was performed by the following procedure.

Furthermore, during measurement, a hall element was disposed in the superconducting coil 2 made of NbTi, a magnetic field generated in the element was converted into a current value, and a change of the value with time was evaluated.

1) The heater wire formed in the permanent current switch 3 was energized to transfer the $MgB_2$ portion 8 to the normal conducting state (39 K or more).
2) For the excitation, the superconducting coil 2 made of NbTi was energized and excited by the power supply 4.
3) Heating of the heater wire formed in the permanent current switch 3 was stopped, and the current of the power supply 4 was lowered.
4) After waiting until the switch was sufficiently cooled, evaluation of the permanent current operation was started.

Figure 6:
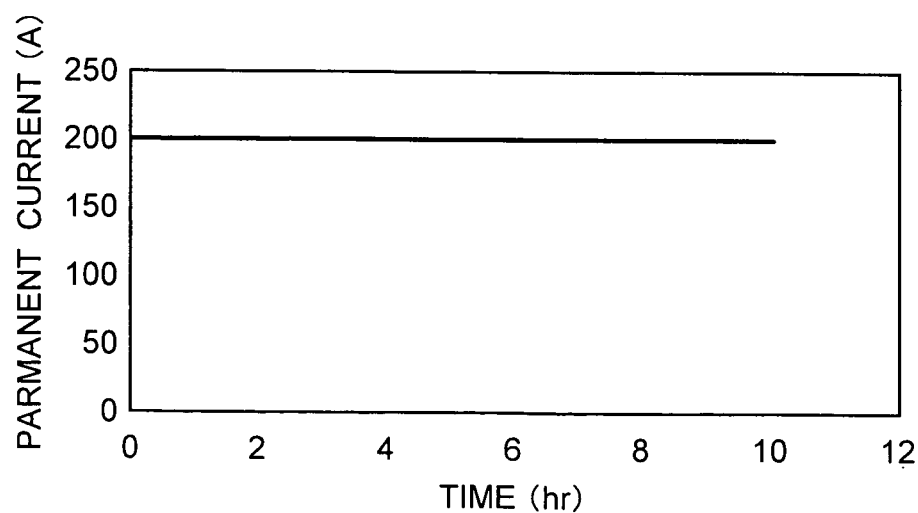
FIG. 6 is a diagram showing a result of a test performed in the embodiment of the present invention.

FIG. 6 shows a relation between a time and a permanent current as an experiment result.

As a representative, a result of an energization current of 200 A is shown. The measurement was performed for ten hours.

As a result of the measurement, it has been found that the transfer to the normal conducting state did not occur even once during the permanent current operation, there was hardly a current decay and the whole closed circuit had a resistance value of $1 \times 10^{-12}$ Ω or less.

Moreover, the energization current was changed from 100 A to 800 A, a similar test was performed, and a result similar to that of FIG. 6 was obtained.

Furthermore, the evaluation was performed for a time as long as 24 hours or more, but similarly any transfer to the normal conducting state or any large current decay was not seen.

From the above result, a permanent current characteristic of the permanent current switch 3 prepared using the $MgB_2$ wire 5 was confirmed, and it was confirmed that the switch was very thermally stable.

Since there might be a possibility of breakage of the permanent current switch 3, the test was discontinued at 1000 A, but the following methods are expected in order to further increase the energization current value:
1. Improvement of a critical current density (Jc) of the $MgB_2$ wire
2. Preparation of a structure in which energization of the $MgB_2$ wire with a large current is possible The above 1, 2 were evaluated in the following example.

EXAMPLE 2

An $MgB_2$ wire 5 was prepared in the same manner as in Example 1 except that NbTi was used in a superconducting metal 7 of the $MgB_2$ wire 5 used in Example 1 in order to improve Jc of the $MgB_2$ wire 5. Subsequently, a permanent current switch 3 was prepared.

Moreover, the switch was superconductively connected to a superconducting wire 9 for a wiring line (an NbTi wire), and further connected to a superconducting coil 2 made of NbTi and an NbTi wire 23 for a current lead to prepare a closed circuit loop, and a permanent current test was performed.

Figure 7:
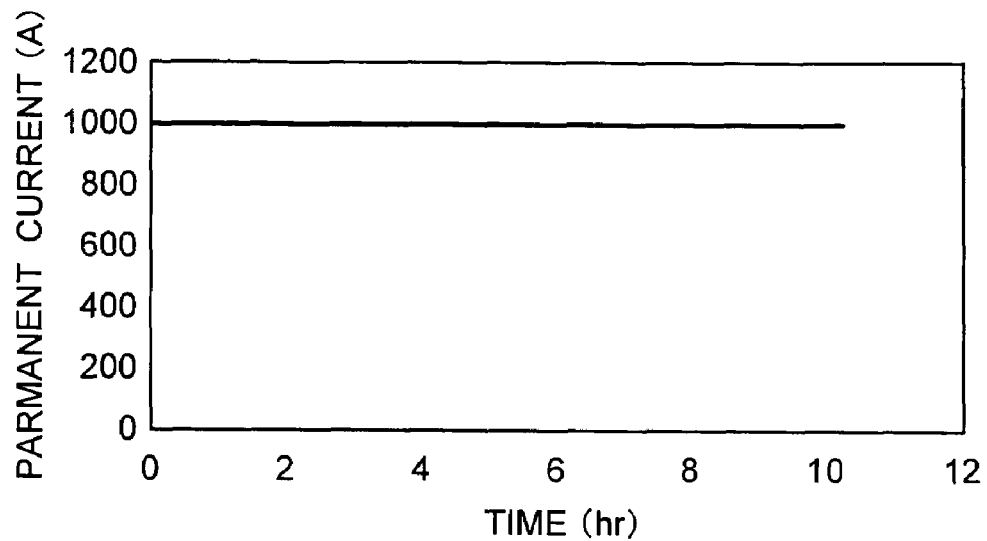
FIG. 7 is a diagram showing a result of a test performed in the embodiment of the present invention.

FIG. 7 shows a relation between a time and a permanent current as an experiment result.

As a representative, a result of an energization current of 1000 A is shown. Measurement was performed for ten hours.

As a result of the measurement, it has been found that transfer to a normal conducting state did not occur even once during a permanent current operation, there was hardly a current decay and the whole closed circuit had a resistance value of $1 \times 10^{-12}$ Ω or less.

Moreover, the energization current was changed from 100 A to 1000 A, a similar test was performed, and a result similar to that of FIG. 7 was obtained.

Furthermore, evaluation was performed for a time as long as 24 hours or more, but similarly any transfer to the normal conducting state or any large current decay was not seen.

From the above result, a permanent current characteristic of the permanent current switch 3 prepared using the $MgB_2$ wire 5 was confirmed, and it was confirmed that the switch was very thermally stable.

This is supposedly because NbTi has a higher hardness and a higher tenacity than Nb, and the $MgB_2$ wire 5 therefore has a high Jc. Therefore, it has been found that a similar effect is obtained, when the $MgB_2$ wire 5 is provided with the high Jc by increasing a processing ratio, optimizing thermal treatment conditions or adding a tertiary element.

Moreover, an effect of improving a critical magnetic field of a superconductive connecting section 16 can be expected.

Furthermore, even when $Nb_3Sn$ is used instead of Nb, a further effect can be expected.

EXAMPLE 3

To pass a large current through an $MgB_2$ wire 5, the $MgB_2$ wire was constituted to have multiple cores.

Figure 8:
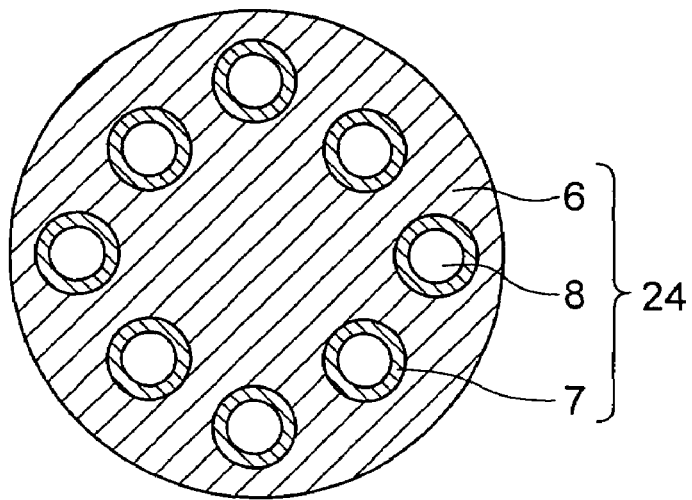
FIG. 8 is a diagram showing a sectional constitution of a multi-core MgB$_2$ wire prepared in the embodiment of the present invention.

FIG. 8 shows one example of a multi-core $MgB_2$ wire 24.

The multi-core $MgB_2$ wire 24 has a structure in which each $MgB_2$ portion 8 is surrounded with a superconducting metal 7, and a plurality of $MgB_2$ portions are arranged in a high-resistance metal 6. After preparing this multi-core $MgB_2$ wire 24, a permanent current switch 3 was prepared. It is to be noted that the $MgB_2$ portion 8 coated with the superconducting metal 7 will be referred to as an $MgB_2$ core.

Moreover, this structure was super-conductively connected to a superconducting wire 9 for a wiring line (an NbTi wire), and further superconductively connected to a superconducting coil 2 made of NbTi and an NbTi wire 23 for a current lead to prepare a closed circuit loop, and a permanent current test was performed.

It is to be noted that even in the multi-core $MgB_2$ wire 24, superconductive connection is performed by a superconductive connecting section 16 basically in the same manner as in the $MgB_2$ wire 5.

Figure 9:
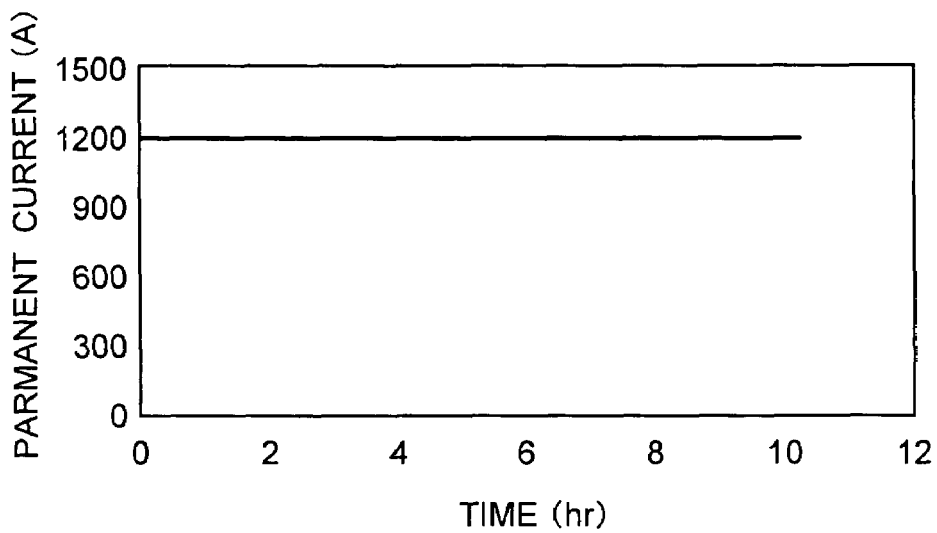
FIG. 9 is a diagram showing a result of a test performed in the embodiment of the present invention.

FIG. 9 shows a relation between a time and a permanent current as a test result.

As a representative, a result of an energization current of 1200 A is shown. Measurement was performed for ten hours.

As a result of the measurement, it has been found that transfer to a normal conducting state did not occur even once during a permanent current operation, there was hardly a current decay and the whole closed circuit had a resistance value of $1 \times 10^{-12}$ Ω or less.

Moreover, the energization current was changed from 100 A to 1500 A, a similar test was performed, and a result similar to that of FIG. 9 was obtained.

Furthermore, evaluation was performed for a time as long as 24 hours or more, but similarly any transfer to the normal conducting state or any large current decay was not seen.

This is because the $MgB_2$ portion 8 has a small diameter. Therefore, the $MgB_2$ portions 8 are highly densely arranged. As a result, a critical current density is increased. Moreover, the wire has a structure in which flux jump does not easily occur. Therefore, a stability or a characteristic of a superconducting wire is improved. Therefore, energization with a large current is possible.

As another multi-core structure, there are considered a structure in which Nb, Ta, NbTa or the like is disposed in the center of the high-resistance metal 6 in order to achieve a high strength, and a structure in which Nb, Ta, NbTa or the like is disposed in a core portion of each $MgB_2$ portion 8 in order to achieve the high strength. A similar effect is obtained from each structure, or even when both of the structures are used in order to achieve a higher strength.

EXAMPLE 4

Instead of a superconducting coil 2 made of NbTi, the superconducting coil 2 was prepared using an $MgB_2$ wire, an $Nb_3Sn$ wire or an $Nb_3Al$ wire.

Figure 10:
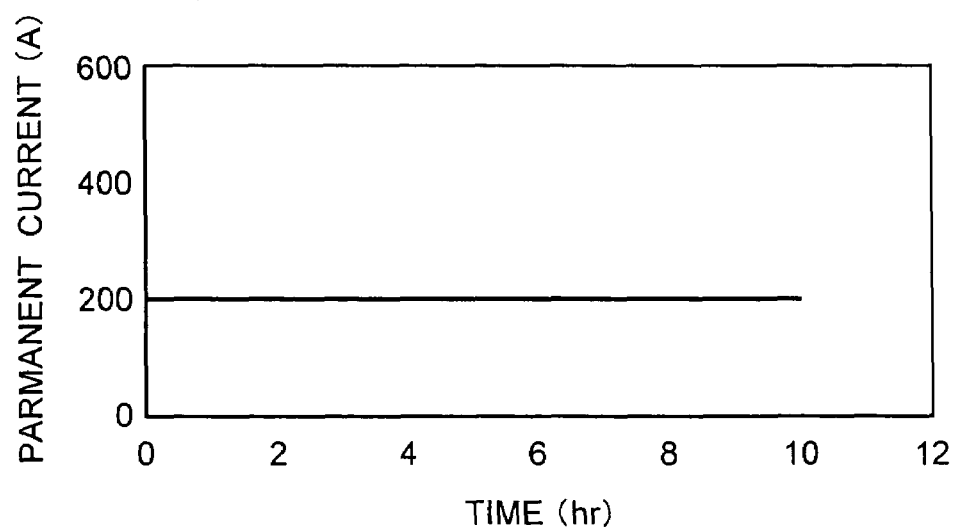
FIG. 10 is a diagram showing a result of a test performed in the embodiment of the present invention.

FIG. 10 shows a relation between a time and a permanent current as a test result. It is to be noted that FIG. 10 shows the result of the use of the superconducting coil 2 of the $MgB_2$ wire.

As a representative, a result of an energization current of 200 A is shown. Measurement was performed for ten hours.

As a result of the measurement, it has been found that transfer to a normal conducting state did not occur even once during a permanent current operation, there was hardly a current decay and the whole closed circuit had a resistance value of $1\times10^{-12}$ Ω or less.

Moreover, the energization current was changed from 100 A to 500 A, a similar test was performed, and a result similar to that of FIG. 10 was obtained.

Furthermore, evaluation was performed for a time as long as 24 hours or more, but similarly any transfer to the normal conducting state or any large current decay was not seen.

In addition, the superconducting coil 2 prepared using the $Nb_3Sn$ wire or the $Nb_3Al$ wire indicated a similar result up to 1500 A.

This is because superconductive connection is possible with a very small connection resistance, even if a permanent current switch 3 of the present embodiment includes the superconducting coil 2 prepared using any superconducting wire.

Furthermore, when a low-melting superconducting alloy 12 for use in forming a superconductive connecting section 16 is $MgB_2$, a permanent current operation at 20 K or more is possible. The alloy can similarly be $Nb_3Sn$, $Nb_3Al$, NbTi or the like, but a critical temperature in this case is 20 K or less.

Moreover, $MgB_2$ has a very high critical temperature. Therefore, it has a very large thermal margin against liquid helium, but it requires a very large projection quantity of heat during PCS-OFF. Therefore, a structure is further effective in which the whole PCS is coated with FRP having a low thermal conductivity, the conductivity against liquid helium is reduced, and heat is accumulated.

Therefore, in a case where the permanent current switch 3 which also serves as the superconductive connecting section 16 prepared using the $MgB_2$ wire of the present embodiment is applied, the permanent current switch 3 having the following characteristics can be provided.

1) A resistance during PCS-ON is very small.
2) A resistance during PCS-OFF can be increased using a high-resistance metal such as CuNi.
3) A rated current can be supplied stably for a long period.
4) A state is not transferred a normal conducting state unless needed.

Moreover, in a case where the permanent current switch of the present embodiment is utilized in a superconducting magnet which requires a permanent current operation in an MRI, an NMR, a magnetically-elevated train or the like, the switch is especially effective.

The present invention relates to a permanent current switch prepared using a magnesium diboride superconducting wire.

Specifically, the present invention can be utilized in a permanent current switch for performing a permanent current operation in a superconducting magnet which requires a permanent current operation of an NMR, an MRI, a magnetically-elevated train, a superconducting power storage device, a magnetic separation device, a magnetic field single crystal lift device, a freezer cooling superconducting magnet device, a superconducting energy storage, a superconducting generator, a magnet for a nuclear fusion reactor or the like.

Especially, since the superconducting magnet operates by the permanent current operation in most of the existing MRI, NMR, magnetically-elevated train or the like.

The invention claimed is:

1. A permanent current switch comprising:
    a coiled superconducting wire and a winding portion which is wound with a heater wire which switches the superconducting wire between a superconducting state and a normal conducting state, the superconducting wire being a magnesium diboride superconducting wire having a high-resistance metal on an outer side and a magnesium diboride superconducting portion on an inner side and prepared by forming a superconducting metal on a layer between the high-resistance metal and the magnesium diboride superconducting portion; and
    a superconductive connecting section superconductively connected to a lead wire of the superconducting wire and a superconducting wire for a wiring line, wherein the superconductive connecting section superconductively connects the magnesium diboride superconducting portion or the superconducting metal with which the magnesium diboride superconducting portion is coated to a superconducting core portion of the superconducting wire for the wiring line via a low-melting superconducting metal or a low-melting superconducting alloy,
    wherein the lead wire comprises a portion having a Nb tube and a high resistance metal and a portion connected to the superconductive connecting section without the high-resistance metal.

2. A permanent current switch comprising:
    a coiled superconducting wire and a winding portion which is wound with a heater wire which switches the superconducting wire between a superconducting state and a normal conducting state, the superconducting wire being a multi-core magnesium diboride superconducting wire having a plurality of magnesium diboride superconducting cores formed by coating magnesium diboride superconducting portions with a superconducting metal and prepared by arranging the plurality of magnesium diboride superconducting cores in a high-resistance metal; and
    a superconductive connecting section superconductively connected to a lead wire of the superconducting wire and a superconducting wire for a wiring line, wherein the superconductive connecting section superconductively connects the magnesium diboride superconducting portion or the superconducting metal with which the magnesium diboride superconducting portion is coated to a superconducting core portion of the superconducting wire for the wiring line via a low-melting superconducting metal or a low-melting superconducting alloy,
    wherein the lead wire comprises a portion having a Nb tube and a high resistance metal and a portion connected to the superconductive connecting section without the high-resistance metal.

3. The permanent current switch according to claim 1, wherein the high-resistance metal is an alloy containing Cu as a main component.

4. The permanent current switch according to claim 1, wherein the superconducting metal is an alloy containing Nb as a main component.

5. The permanent current switch according to claim 1, wherein the low-melting superconducting metal or the low-melting superconducting alloy is made of at least one or more metals of Sn, Mg, In, Ga, Pb, Te, Tl, Zn, Bi and Al.

6. The permanent current switch according to claim 2, wherein the high-resistance metal is an alloy containing Cu as a main component.

7. The permanent current switch according to claim 2, wherein the superconducting metal is an alloy containing Nb as a main component.

8. The permanent current switch according to claim 2, wherein the low-melting superconducting metal or the low-melting superconducting alloy is made of at least one or more metals of Sn, Mg, In, Ga, Pb, Te, Tl, Zn, Bi and Al.

9. The permanent current switch according to claim 1, wherein permanent current switch is a component of a superconducting magnet that includes a superconductivity coil and a power supply, and wherein the permanent current switch is connected in parallel with said superconductivity coil and said power supply.

10. The permanent current switch according to claim 2, wherein permanent current switch is a component of a superconducting magnet that includes a superconductivity coil and a power supply, and wherein the permanent current switch is connected in parallel with said superconductivity coil and said power supply.

* * * * *